(12) United States Patent
Chang et al.

(10) Patent No.: US 10,076,047 B1
(45) Date of Patent: Sep. 11, 2018

(54) ELECTRONIC DEVICE CHASSIS AND ELECTRONIC DEVICE

(71) Applicant: Wistron Corporation, New Taipei (TW)

(72) Inventors: Cheng-Tang Chang, New Taipei (TW); Jyun-Yi Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/849,612

(22) Filed: Dec. 20, 2017

(30) Foreign Application Priority Data

Oct. 24, 2017 (TW) .............................. 106215627 U

(51) Int. Cl.
| | |
|---|---|
| H05K 7/02 | (2006.01) |
| H05K 7/04 | (2006.01) |
| H05K 5/02 | (2006.01) |
| H05K 7/10 | (2006.01) |
| H05K 7/12 | (2006.01) |
| H01M 2/20 | (2006.01) |
| H05K 7/14 | (2006.01) |
| H01M 2/10 | (2006.01) |

(52) U.S. Cl.
CPC ........ *H05K 5/0256* (2013.01); *H01M 2/1016* (2013.01); *H01M 2/202* (2013.01); *H05K 5/0221* (2013.01); *H05K 7/10* (2013.01); *H05K 7/12* (2013.01); *H05K 7/1401* (2013.01)

(58) Field of Classification Search
CPC ...... H05K 5/0256; H05K 5/0221; H05K 7/10; H05K 7/12; H05K 7/1401; H01M 2/1016; H01M 2/202
USPC .......................................... 361/807, 809, 810
See application file for complete search history.

(56) References Cited

U.S. PATENT DOCUMENTS

| | | | | |
|---|---|---|---|---|
| 5,740,012 A | * | 4/1998 | Choi ..................... | G06F 1/1616 361/679.39 |
| 8,982,566 B2 | * | 3/2015 | Huang ................. | H01R 12/721 361/729 |
| 9,454,190 B2 | * | 9/2016 | Mao ..................... | H05K 7/1487 |
| 9,930,797 B1 | * | 3/2018 | Liu ..................... | H01R 13/7175 |

\* cited by examiner

*Primary Examiner* — Hung S Bui
(74) *Attorney, Agent, or Firm* — JCIPRNET

(57) ABSTRACT

An electronic device chassis includes a casing and two limitation mechanisms. The casing includes two accommodating zones. The two limitation mechanisms are rotatably disposed at the casing. Each of the limitation mechanisms includes a first engaging portion near one of the accommodating zones, and a linkage structure near the other one of the accommodating zones, so that when the limitation mechanism is rotated, the first engaging portion and the linkage structure enter or leave the two accommodating zones, respectively. When two electronic assemblies are disposed in the two accommodating zones, two second engaging portions of the two electronic assemblies are located in rotating paths of the two first engaging portions, and a portion of each of the limitation mechanisms is located in a moving path of the corresponding electronic assembly. An electronic device is further provided.

19 Claims, 9 Drawing Sheets

US 10,076,047 B1

ELECTRONIC DEVICE CHASSIS AND ELECTRONIC DEVICE

CROSS-REFERENCE TO RELATED APPLICATION

This application claims the priority benefit of Taiwan application serial no. 106215627, filed on Oct. 24, 2017. The entirety of the above-mentioned patent application is hereby incorporated by reference herein and made a part of this specification.

BACKGROUND

Field of the Invention

The invention relates to an electronic device chassis and an electronic device, and more specifically relates to an electronic device chassis having limitation mechanisms and an electronic device.

Description of Related Art

In the current market, some of the electronic devices require to have limitation mechanisms to restrict movements of a plurality of electronic assemblies disposed inside. For example, some of electronic devices may be powered by two batteries due to long time and continuous operation. When replacing battery, one of the batteries remains and power the electronic device, so the electronic device can be kept operating when another batteries is replaced. In other words, with this type of electronic device, the two batteries cannot be replaced at the same time. When one of the batteries is replaced, another one of the batteries had better be restricted and cannot be removed. Some examples of the need to restrict the two electronic assemblies inside the electronic device are described above. Further, how to restrict the two electronic assemblies inside the electronic device by a simple structure is one of the urgent researching directions in the field.

SUMMARY

The invention provides an electronic device chassis which has simple structure for entering or leaving two accommodating slots used to accommodate two electronic assemblies inside of the electronic device, so as to restrict positions of the two electronic assemblies.

The invention provides an electronic device including the electronic device chassis.

The electronic device chassis of the invention is configured to detachably dispose two electronic assemblies, the electronic device chassis includes a casing and two limitation mechanisms. The casing includes two accommodating zones arranged along an axis, the two electronic assemblies are configured to be detachably disposed at the two accommodating zones along the axis. The two limitation mechanisms are rotatably disposed at the casing, wherein one of the limitation mechanisms is located near a side of each of the accommodating zones, the other one of the limitation mechanisms is located near another side opposite to the side of each of the accommodating zones, each of the limitation mechanisms comprises a first engaging portion and a linkage structure, in each of the limitation mechanisms, the first engaging portion is located near one of the accommodating zones and the linkage structure is located near the other one of the accommodating zones so that, when the limitation mechanism is rotated, the first engaging portion and the linkage structure enter or leave the two accommodating zones, respectively. The two electronic assemblies include two second engaging portions corresponding to the two first engaging portions. When the two electronic assemblies are disposed in the two accommodating zones, the two second engaging portions are located in rotating paths of the two first engaging portions, and a portion of each of the limitation mechanisms is located in a moving path of the corresponding electronic assembly.

An electronic device of the invention includes an electronic device chassis and two electronic assemblies. An electronic device chassis includes a casing and two limitation mechanisms. The casing includes two accommodating zones arranged along an axis. The two limitation mechanisms are rotatably disposed at the casing, wherein one of the limitation mechanisms is located near a side of each of the accommodating zones, the other one of the limitation mechanisms is located near another side opposite to the side of each of the accommodating zones, each of the limitation mechanisms comprises a first engaging portion and a linkage structure, in each of the limitation mechanisms, the first engaging portion is located near one of the accommodating zones and the linkage structure is located near the other one of the accommodating zones so that, when the limitation mechanism is rotated, the first engaging portion and the linkage structure enter or leave the two accommodating zones, respectively. The two electronic assemblies are detachably disposed at the two accommodating zones along the axis, each of the electronic assembly includes a second engaging portion, the two second engaging portions respectively correspond to the two first engaging portions. When the two electronic assemblies are disposed in the two accommodating zones, the two second engaging portions are located in rotating paths of the two first engaging portions, and a portion of each of the limitation mechanisms is located in a moving path of the corresponding electronic assembly.

In one embodiment of the invention, each of the accommodating zones has a first side, a second side opposite the first side, and a third side located between the first side and the second side, the two third sides of the two accommodating zones are opposite each other, wherein the first side of one of the accommodating zones and the second side of the other one of the accommodating zones are coplanar with each other, in each of the limitation mechanisms, the first engaging portion is located near the first side of one of the accommodating zones and the linkage structure is located near the second side of the other one of the accommodating zones.

In one embodiment of the invention, wherein each of the linkage structures comprises a first bending arm and a second bending arm extending in different directions, the first bending arm and the second bending arm of each of the linkage structures are respectively located near the third side and the second side of one of the accommodating zones.

In one embodiment of the invention, each of the electronic assemblies has a first electronic assembly side surface, a second electronic assembly side surface opposite the first electronic assembly side surface, and a third electronic assembly side surface located between the first electronic assembly side surface and the second electronic assembly side surface, the second engaging portion is located on the first electronic assembly side surface, the first bending arm is configured to lean against the third electronic assembly side surface.

In one embodiment of the invention, when the two electronic assemblies are located in the two accommodating zones, the second bending arm of one of the linkage structures is located in the moving path of the corresponding electronic assembly, and a gap exists between the second bending arm and a hook of the second electronic assembly side surface of the electronic assembly, the first engaging portion of the other linkage structure leans against the first electronic assembly side surface of the electronic assembly.

In one embodiment of the invention, each of the second bending arms comprises an inclined surface, when one of the electronic assemblies is removed from the corresponding accommodating zone, the limitation mechanism is configured to rotate so that the inclined surface of the second bending arm moves out of the moving path of the electronic assembly and allows the electronic assembly to pass through, and the first engaging portion of the limitation mechanism rotates along with the second bending arm to engage with the second engaging portion of the other one of the electronic assembly located in the accommodating zone.

In one embodiment of the invention, each of the second bending arms comprises a stop surface, when the two electronic assemblies together are removed from the two accommodating zones along the axis in opposite directions, the two second engaging portions are configured to move away from the rotating paths of the two first engaging portions so that the two first engaging portions of the two limitation mechanisms respectively lean against wall surfaces of the two electronic assemblies, the wall surfaces are beside the two second engaging portions, and the two stop surfaces are configured to restrict the two electronic assemblies so as to prevent the two electronic assemblies from being removed from the two accommodating zones.

In one embodiment of the invention, the electronic device further includes two first connecting ports, disposed at the casing and located in the two accommodating zones, wherein each of the electronic assemblies comprises a second connecting port, the two first connecting ports are configured to dock in the two second connecting ports.

In one embodiment of the invention, the two electronic assemblies are two batteries.

In one embodiment of the invention, the electronic device chassis further includes two torsional springs disposed between the two limitation mechanisms and the casing.

In one embodiment of the invention, the first engaging portion is a hook and the second engaging portion is a groove.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
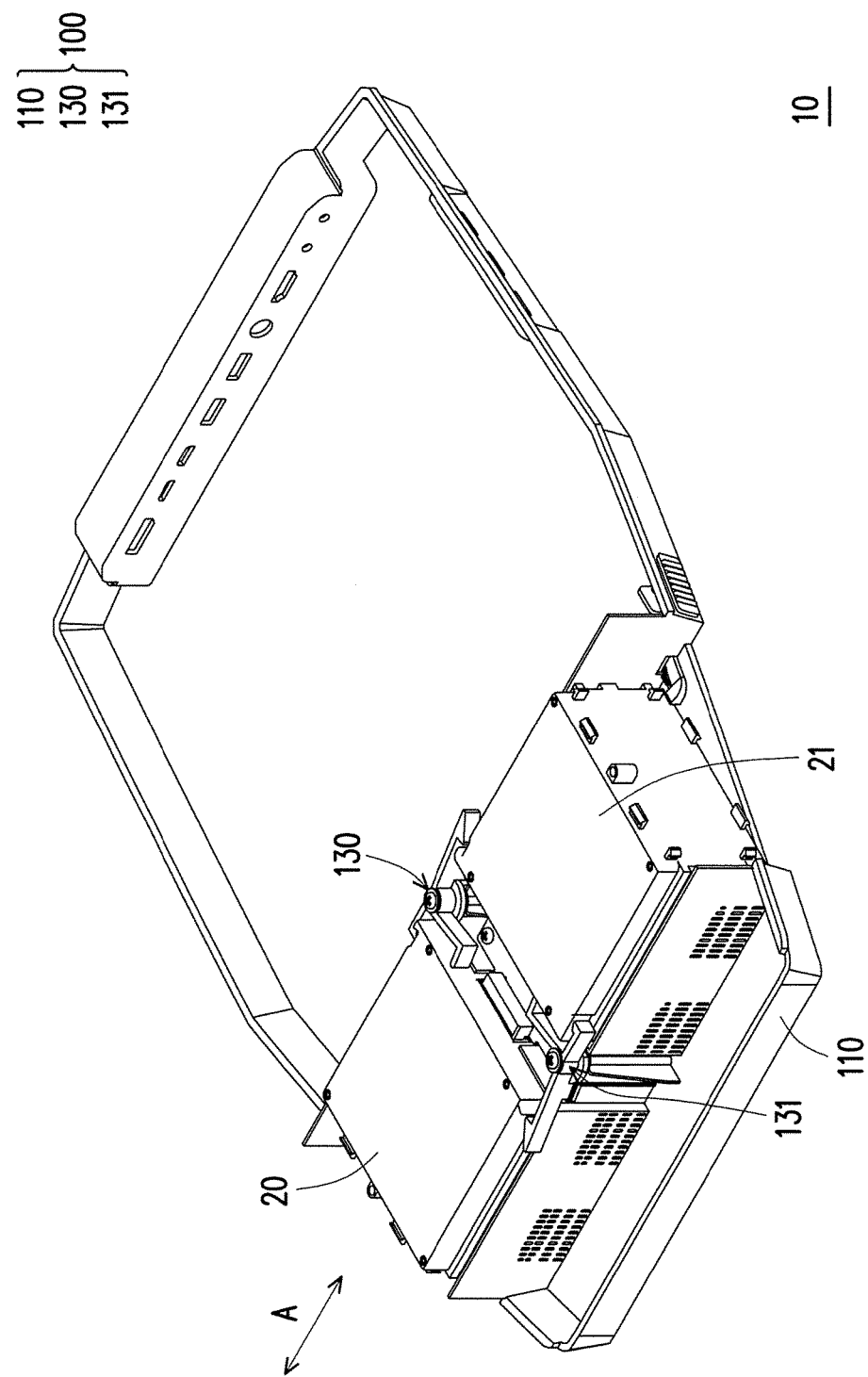
FIG. 1 is a three-dimensional schematic view of a part of an electronic device of an embodiment of the invention.

FIG. 1 is a three-dimensional schematic view of a part of an electronic device of an embodiment of the invention. Referring to FIG. 1, an electronic device 10 of the present embodiment includes an electronic device chassis 100 and two electronic assemblies 20 and 21. In the present embodiment, the electronic device 10 may be, for example, game console, the electronic assemblies 20 and 21 may be, for example, batteries, but the types of the electronic device 10 and the electronic assemblies 20 and 21 are not limited thereto. The electronic device 10 of the present embodiment includes limitation mechanisms 130 and 131 that can be simply operated and restrict the movement of the two electronic assemblies 20 and 21. For example, by using the limitation mechanisms 130 and 131, the two electronic assemblies 20 and 21 cannot be removed at the same time, and, when one of the electronic assemblies 20 and 21 is removed, the other one of the electronic assemblies 20 and 21 cannot be removed. The details are described hereinafter.

Figure 2:
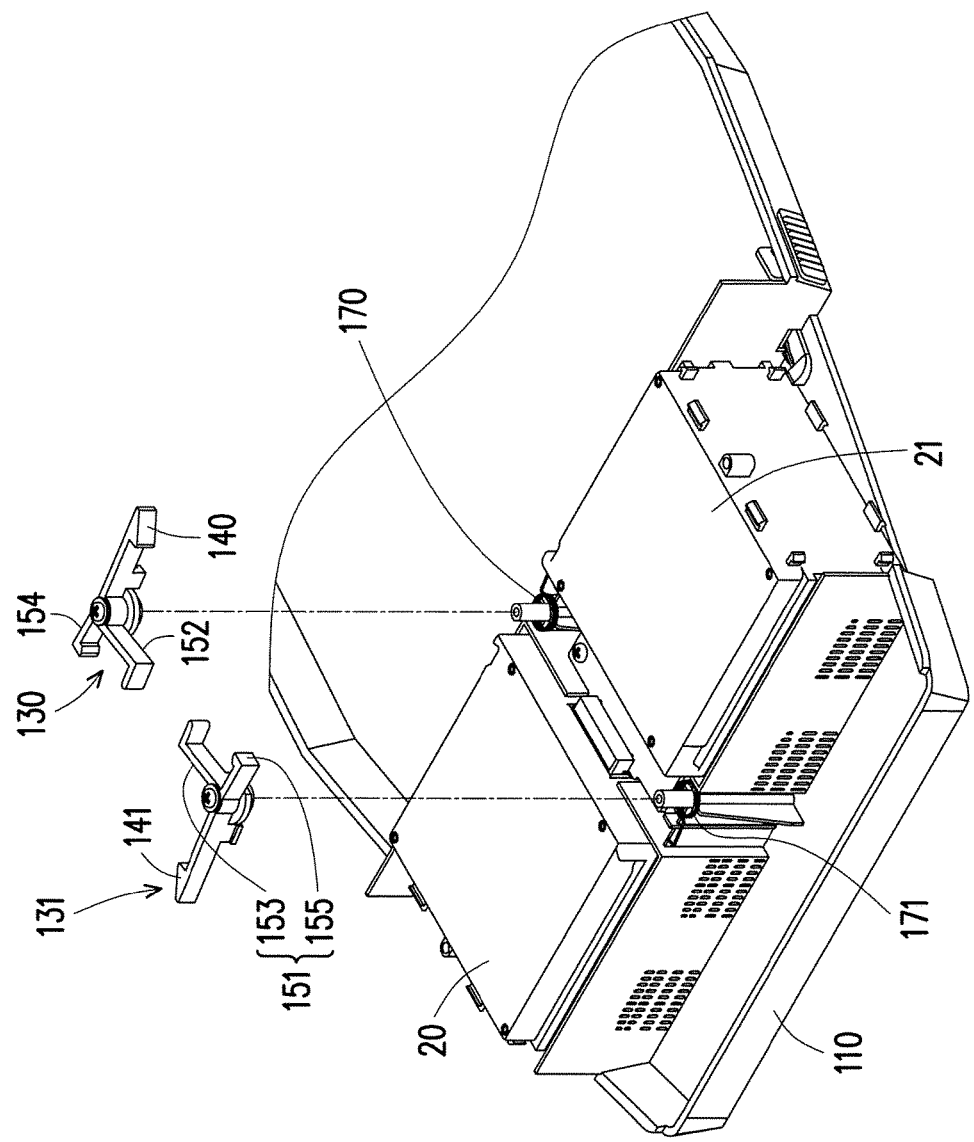
FIG. 2 is a partial three-dimensional schematic view illustrating limitation mechanisms being detached from the electronic device in FIG. 1.
Figure 3:
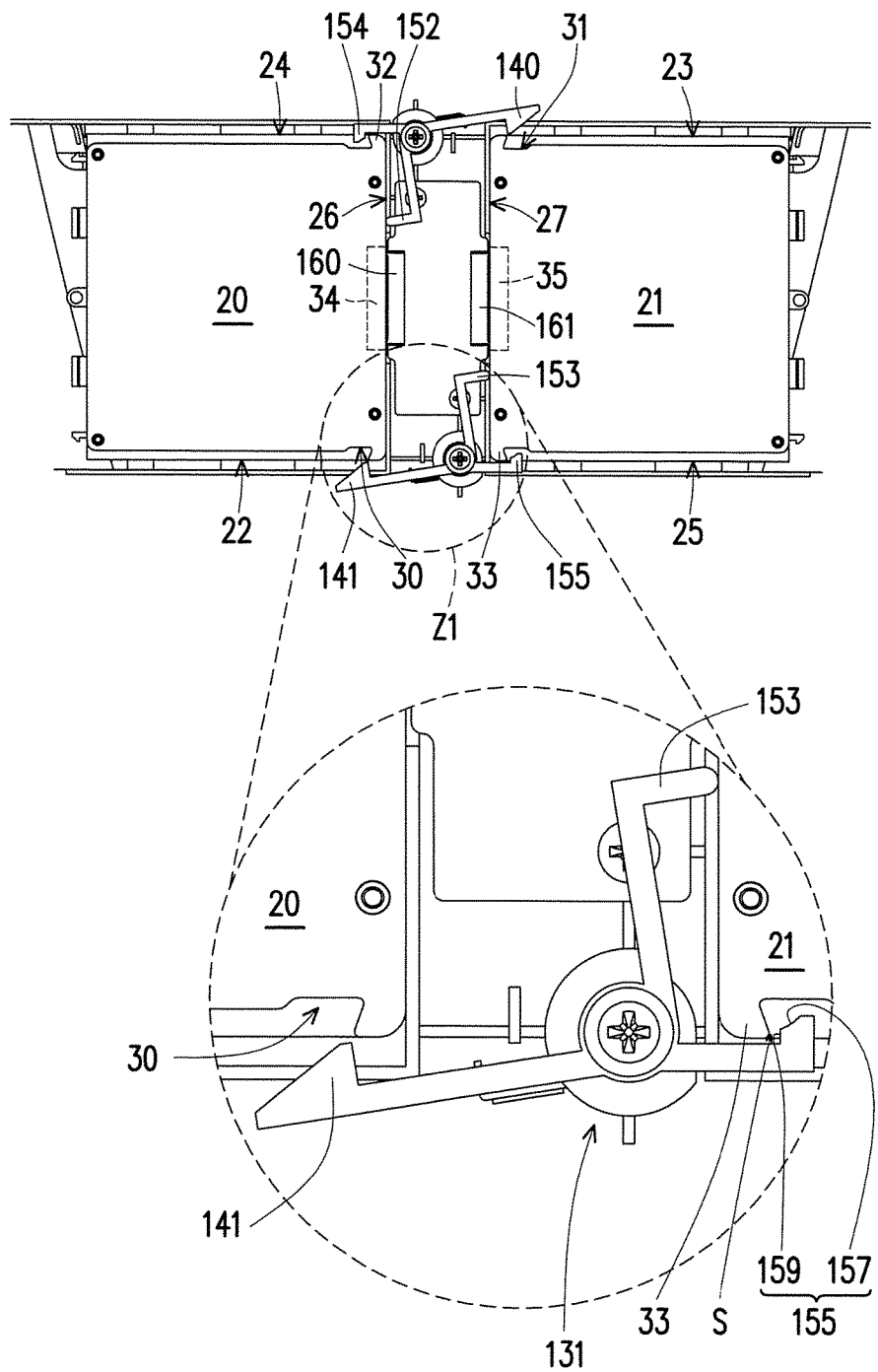
FIG. 3 is a partial schematic top view of the electronic device in FIG. 1.
Figure 4:
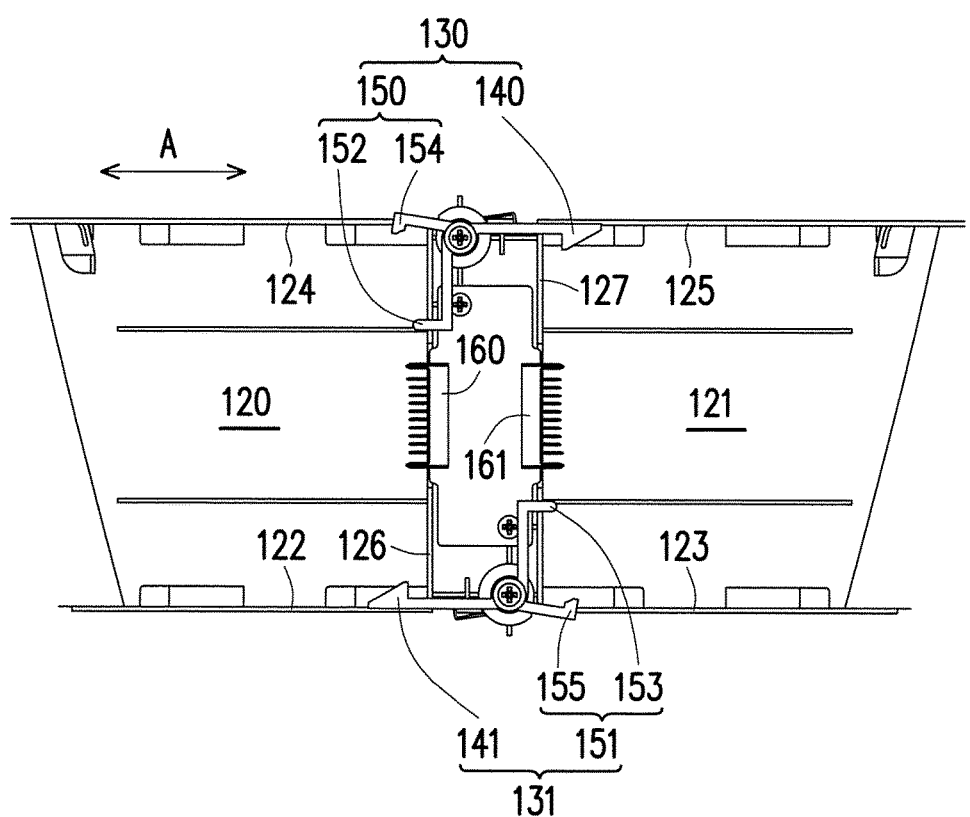
FIG. 4 is a schematic top view of an electronic device chassis of the electronic device in FIG. 1.

FIG. 2 is a partial three-dimensional schematic view illustrating limitation mechanisms being detached from the electronic device in FIG. 1. FIG. 3 is a partial schematic top view of the electronic device in FIG. 1. FIG. 4 is a schematic top view of an electronic device chassis of the electronic device in FIG. 1. In FIG. 3, a zoom area Z1 is enlarged so as to clearly show the positional relationship between the elements.

Referring FIG. 1 to FIG. 4 simultaneously, in the present embodiment, the electronic device chassis 100 (shown in FIG. 1) includes a casing 100, two limitation mechanisms 130 and 131, and two torsional springs 170 and 171 (shown in FIG. 2) disposed between the two limitation mechanisms 130 and 131 and the casing 110. As shown in FIG. 4, the casing 110 includes two accommodating zones 120 and 121 arranged along an axis A. The two limitation mechanisms 130 and 31 are rotatably disposed at the casing 110 and are restored by the two torsional springs 170 and 171 (shown in FIG. 2). Certainly, in other embodiments, the torsional springs 170 and 171 may also be omitted in the electronic device chassis 100.

In present embodiment, one of the limitation mechanisms 130 and 131 is located near a side of each of the accommodating zones 120 and 121, the other one of the limitation mechanisms 130 and 131 is located near another side opposite to the side of each of the accommodating zones 120 and 121. Specifically, the accommodating zones 120 and 121 respectively have a first side 122 and a first side 125 opposite each other, respectively have a second side 124 and a second side 123 opposite each other, and respectively have a third side 126 located between the first side 122 and the second side 124 and a third side 127 located between the first side 125 and the second side 123. In the present embodiment, the two third sides 126 and 127 of the two accommodating zones 120 and 121 are opposite each other, the first side 122 of the accommodating zone 120 and the second side 123 of the accommodating zone 121 are coplanar with each other, and the second side 124 of the accommodating zone 120 and the first side 125 of the accommodating zone 121 are coplanar with each other.

In the present embodiment, the limitation mechanisms 130 and 131 respectively include a first engaging portion 140 and a first engaging portion 141 and respectively include a linkage structure 150 and a linkage structure 151. In the limitation mechanism 130, the first engaging portion 140 is located near the first side 125 of the accommodating zone 121 and the linkage structure 150 is located near the second side 124 of the accommodating zone 120. Additionally, in the limitation mechanism 131, the first engaging portion 141 is located near the first side 122 of the accommodating zone 120 and the linkage structure 151 is located near the second side 123 of the accommodating zone 121. In other words, when the limitation mechanism 130 is rotated, the first engaging portion 140 and the linkage structure 150 respectively enter or leave the two accommodating zones 121 and 120. When the limitation mechanism 131 is rotated, the first engaging portion 141 and the linkage structures 151 respectively enter or leave the two accommodating zones 120 and 121.

In detail, the linkage structure 150 includes a first bending arm 152 and a second bending arm 154 extending in different directions, and the linkage structure 151 includes a first bending arm 153 and a second bending arm 155 extending in different directions. The first bending arm 152 and the second bending arm 154 of the linkage structure 130 are respectively located near the third side 126 and the second side 124 of the accommodating zone 120, and the first bending arm 153 and the second bending arm 155 of the linkage structure 131 are respectively located near the third side 127 and the second side 123 of the accommodating zone 121.

As shown in FIG. 3, in the present embodiment, the two electronic assemblies 20 and 21 are configured to be detachably disposed at the two accommodating zones 120 and 121 along the axis A. The electronic assembly 20 has a first electronic assembly side surface 22, a second electronic assembly side surface 24 opposite the first electronic assembly side surface 22, and a third electronic assembly side surface 26 located between the first electronic assembly side surface 22 and the second electronic assembly side surface 24. The electronic assembly 21 has a first electronic assembly side surface 23, a second electronic assembly side surface 25 opposite the first electronic assembly side surface 23, and a third electronic assembly side surface 27 located between the first electronic assembly side surface 23 and the second electronic assembly side surface 25.

Referring to FIGS. 3 and 4 simultaneously, in the present embodiment, the first electronic assembly side surface 22, the second electronic assembly side surface 24, and the third electronic assembly side surface 26 of the electronic assembly 20 are opposite the first side 122, the second side 124, and the third side 126 of the accommodating zone 120, respectively. The first electronic assembly side surface 23, the second electronic assembly side surface 25, and the third electronic assembly side surface 27 of the electronic assembly 21 are opposite the first side 123, the second side 125, and the third side 127 of the accommodating zone 121, respectively.

The electronic assembly 20 includes a second engaging portion 30 located at the first electronic assembly side surface 22 and a hook 32 located at the second electronic assembly side surface 24. The electronic assembly 21 includes a second engaging portion 31 located at the first electronic assembly side surface 23 and a hook 33 located at the second electronic assembly side surface 25. The two second engaging portions 30 and 31 of the two electronic assemblies 20 and 21 respectively correspond to the two first engaging portions 141 and 140 of the limitation mechanisms 131 and 130. In the present embodiment, each of the first engaging portions 140 and 141 is a hook, and each of the second engaging portions 30 and 31 is a groove, but the types of the first engaging portions 140 and 141 and the second engaging portions 30 and 31 are not limited thereto.

Otherwise, in the present embodiment, the electronic device 10 further includes two first connecting ports 160 and 161 disposed at the casing 110 and located in the two accommodating zones 120 and 121. The two electronic assemblies 20 and 21 respectively include a second connecting port 34 and a second connecting port 35, the two first connecting ports 160 and 161 are configured to dock in the two second connecting ports 34 and 35, so as to provide electric signal communication.

Return to FIG. 4, in this state, the first bending arms 152 and 153 of the limitation mechanisms 130 and 131 are not pushed by the two electronic assemblies 20 and 21 and are connected to the torsional springs 170 and 171 (shown in FIG. 2), which is at the position having lowest elastic potential energy, of the limitation mechanisms 130 and 131. In other words, when the limitation mechanisms 130 and 131 are not pushed by the two electronic assemblies 20 and 21, the limitation mechanisms 130 and 131 receive elastic forces of the torsional springs 170 and 171 and return to the state in FIG. 4. When the limitation mechanisms 130 and 131 are pushed by the two electronic assemblies 20 and 21, the limitation mechanisms 130 and 131 rotate correspondingly and restrict or not restrict the movement of the two electronic assemblies 20 and 21.

The method of inserting the electronic assembly 20 into the electronic device chassis 100 is introduced hereinafter.

Figure 5:
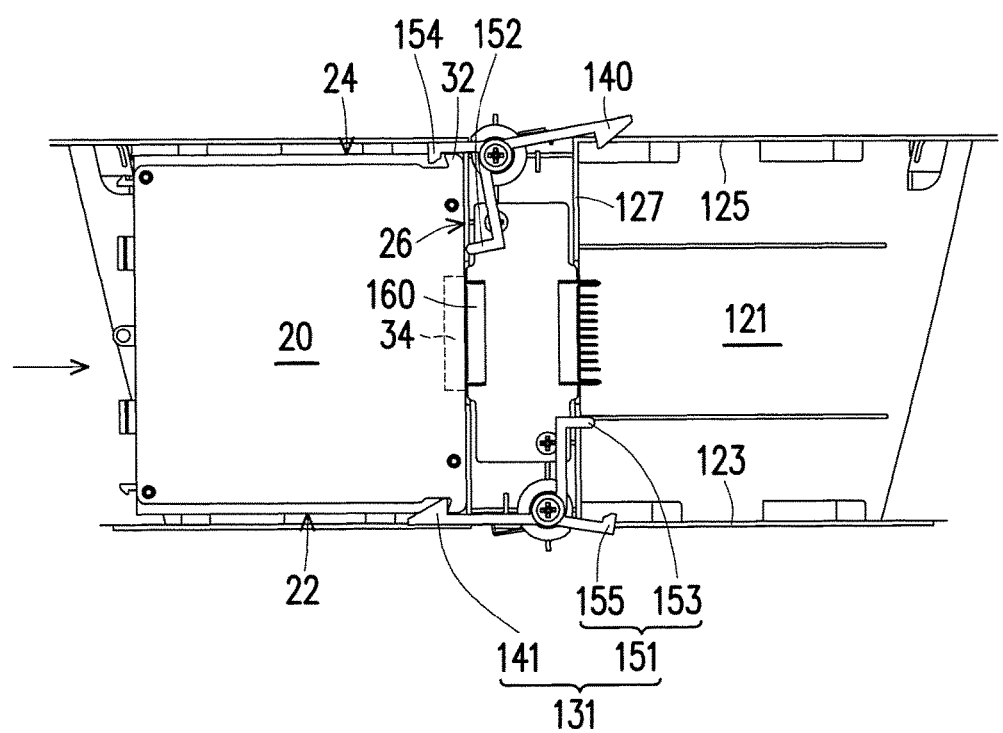
FIG. 5 is a schematic top view illustrating one electronic assembly being inserted into the electronic device chassis of the electronic device in FIG. 4.

FIG. 5 is a schematic top view illustrating one electronic assembly being inserted into the electronic device chassis of the electronic device in FIG. 4. Referring to FIGS. 4 and 5 simultaneously, in the present embodiment, when the electronic assembly 20 moves into the accommodating zone 120 along an inserting direction (such as left-to-right direction), considering the limitation mechanism 130, the third electronic assembly side surface 26 of the electronic assembly 20 pushes against the first bending allii 152 of the linkage structure 150, so that the limitation mechanism 130 rotates counterclockwise an angle. Considering the limitation mechanism 131, the outer surface of the first engaging portion 141 of the limitation mechanism 131 is pushed by a part, which is near the second engaging portion 30 (shown in FIG. 3), of the first electronic assembly side surface 22 of the electronic assembly 20, so that the limitation mechanism 131 rotates along the counterclockwise direction. Until the electronic assembly 20 is positioned, the first engaging portion 141 is not pushed and rotates clockwise to return, so the first engaging portion 141 engages with the second engaging portion 30 and is positioned as shown in FIG. 5.

Next, if only the electronic assembly 21 (shown in FIG. 3) is inserted into the accommodating zone 121 of the electronic device chassis 100, the limitation mechanisms 130 and 131 operates in the same manner. Considering the limitation mechanism 130, the outer surface of the first engaging portion 140 of the limitation mechanism 130 is pushed by a part, which is near the second engaging portion 31, of the first electronic assembly side surface 23 of the electronic assembly 21, so that the limitation mechanism 130 rotates along the counterclockwise direction. Until the electronic assembly 21 is positioned, the first engaging portion 140 is not pushed and rotates clockwise to return, so the first engaging portion 140 engages with the second engaging portion 31. Considering the limitation mechanism 131, the third electronic assembly side surface 27 of the electronic assembly 21 pushes against the first bending arm 153 of the linkage structure 151, so that the limitation mechanism 131 rotates counterclockwise.

In addition, if the electronic assembly 20 is already located in the accommodating zone 120, when the electronic assembly 21 moves into the accommodating zone 121, the limitation mechanism 130 will not be pushed, the third electronic assembly side surface 27 of the electronic assembly 21 pushes against the first bending arm 153 of the linkage structure 151 of the limitation mechanism 131, so that the limitation mechanism 131 rotates along the counterclockwise direction and moves to the position shown in FIG. 3.

As shown in FIG. 3, when the two electronic assemblies 20 and 21 are disposed in the two accommodating zones 120 and 121, the two second engaging portions 30 and 31 are located in rotating paths of the two first engaging portions 140 and 141, and the second bending alms 154 and 155 of the linkage structures 150 and 151 of the limitation mechanisms 130 and 131 are located in moving paths of the electronic assembly 20 and 21, respectively. Moreover, there is a gap S existing between the second bending arm 155 of the linkage structure 151 and the hook 33 of the second electronic assembly side surface 25 of the electronic assembly 21, and the first engaging portion 140 of the linkage structure 150 leans against the first electronic assembly side surface 23 of the electronic assembly 21. Similarly, there is a gap existing between the second bending aun 154 of the linkage structure 150 and the hook 32 of the second electronic assembly side surface 24 of the electronic assembly 20, and the first engaging portion 141 of the linkage structure 151 leans against the first electronic assembly side surface 22 of the electronic assembly 20.

The operation of the limitation mechanism 131 when the electronic assembly 21 is removed from the electronic device chassis 100 is introduced hereinafter.

Figure 6:
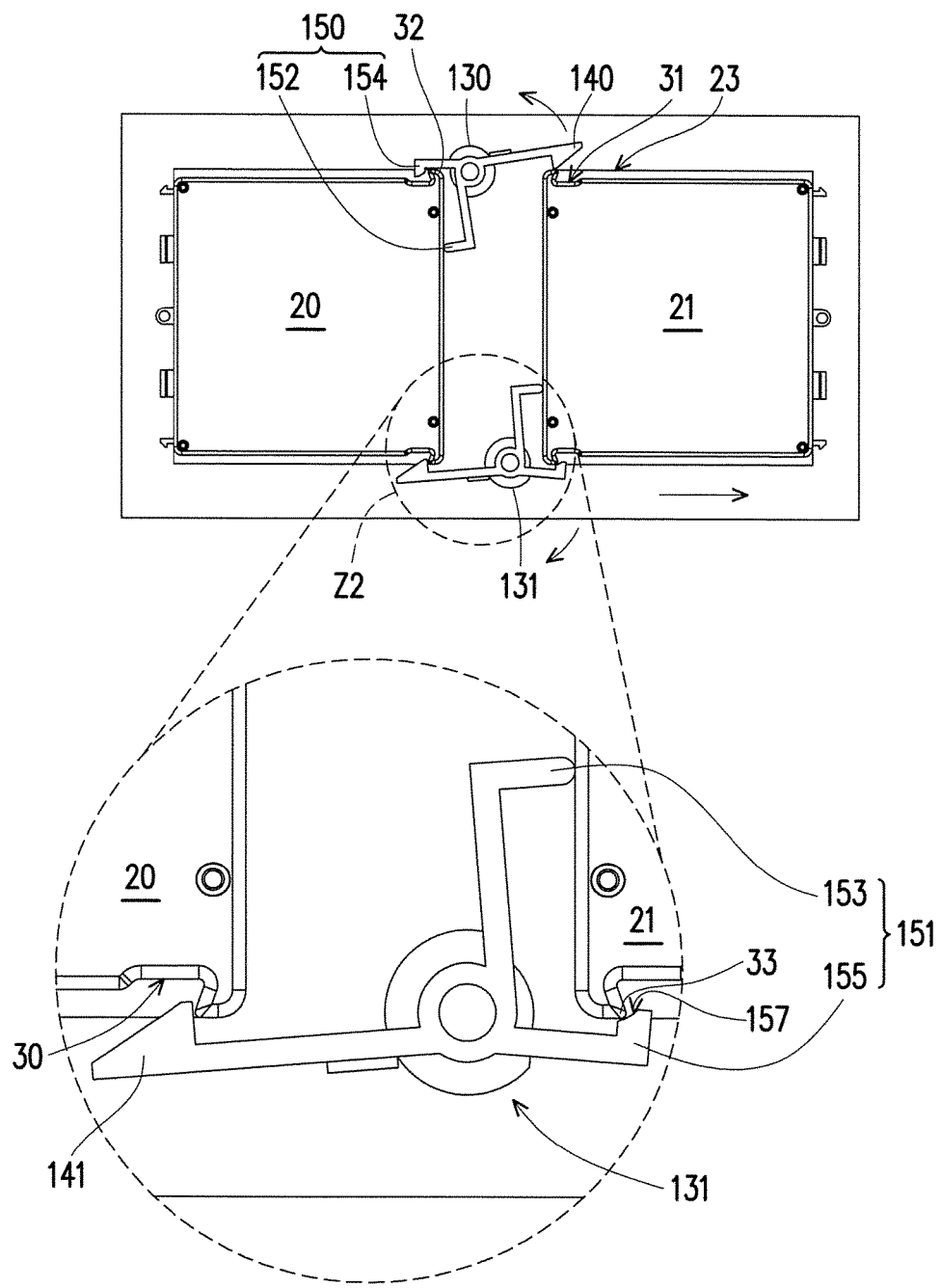
FIG. 6 and FIG. 7 are schematic views illustrating a process of removing one of the electronic assemblies from the electronic device chassis.
Figure 7:
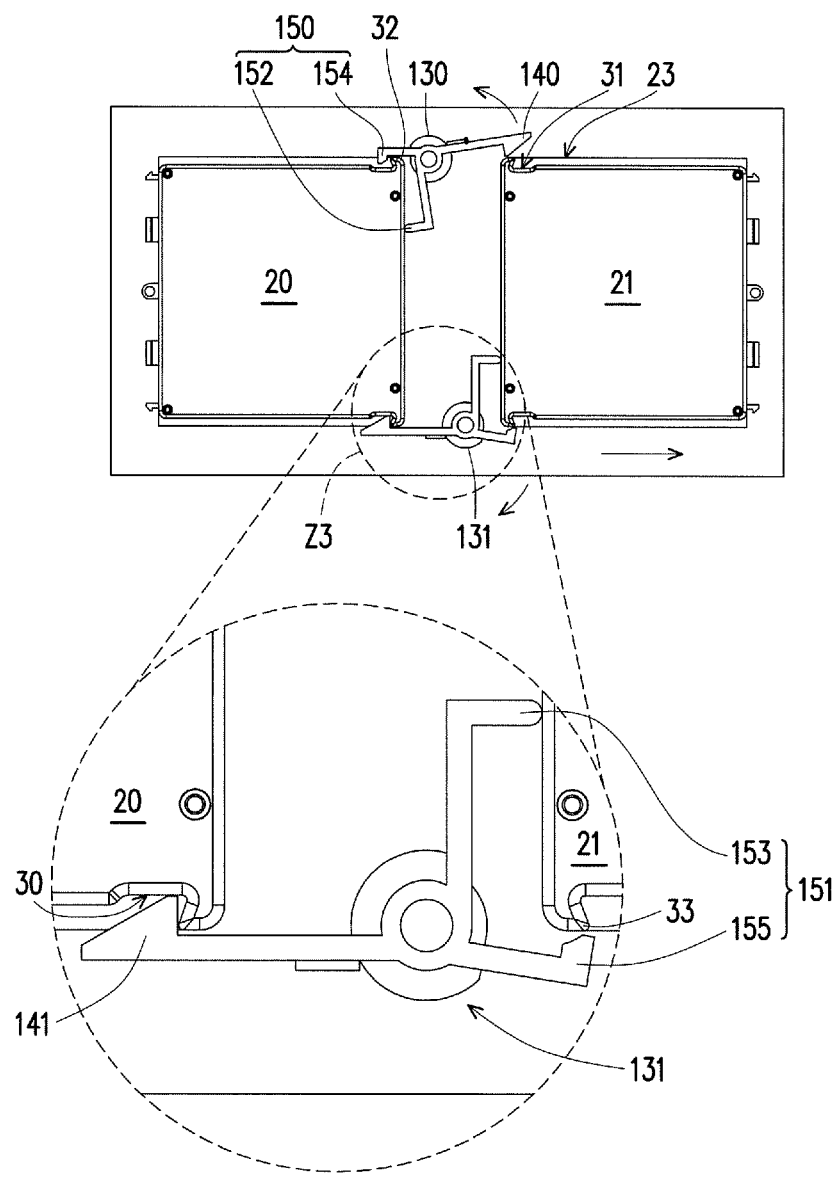

FIG. 6 and FIG. 7 are schematic views illustrating a process of removing one of the electronic assemblies from the electronic device chassis. Zoom areas Z2 and Z3 are respectively enlarged in FIG. 6 and FIG. 7, so as to clearly show the operation. Referring to FIG. 6 and FIG. 7, when the electronic assembly 20 on the left is located in the accommodating zone 120 and the electronic assembly 21 on the right moves along a direction out of the accommodating zone 121, the limitation mechanism 131 receives elastic potential energy released by the torsional spring 171 (as shown in FIG. 2) and rotates clockwise, the second bending arm 155 rotates clockwise accordingly and moves out of the moving path of the electronic assembly 21. In the present embodiment, the second bending arm 155 has an inclined surface 157, and the second bending aini 155 allows the hook 33 to pass through by a gap formed by the chamfer at the inclined surface 157, to ensure that the electronic component 21 can be smoothly removed and is not blocked by the second bending arm 155.

In addition, when the limitation mechanism 131 rotates clockwise, the first engaging portion 141 rotates along with the limitation mechanism 131 to engage with the second engaging portion 30 of the electronic assembly 20 located in the accommodating zone 120, as shown in FIG. 7. As a result, the electronic assembly 20 on the left is restricted and cannot move in a direction out of the accommodating zone 120, so as to achieve fool-proof effect.

Otherwise, in the process of the removing the electronic assembly 21, the second engaging portion 31 moves out of the rotating path of the first engaging portion 140, the first engaging portion 140 of the limitation mechanism 130 is located above and leans against the first electronic assembly side surface 23 of the electronic assembly 21, so that the second bending arm 154 is located in the moving path of the hook 32 and in the direction out of the accommodating zone 120 (such as right-to-left direction). Therefore, the electronic assembly 20 on the left is also restricted by the second bending arm 154 of the limitation mechanism 130 and cannot be moved in a direction out of the accommodating zone 120 (such as right-to-left direction).

That is, in the process of the user removing the electronic assembly 21, the electronic assembly 20 is automatically restricted by the limitation mechanisms 130 and 131 and cannot be removed from the accommodating zone 120. It is convenient for the user to operate without having to perform any other additional actions.

The operation of the limitation mechanisms 130 and 131 when the electronic assemblies 20 and 21 are removed from the electronic device chassis 100 is introduced hereinafter.

Figure 8:
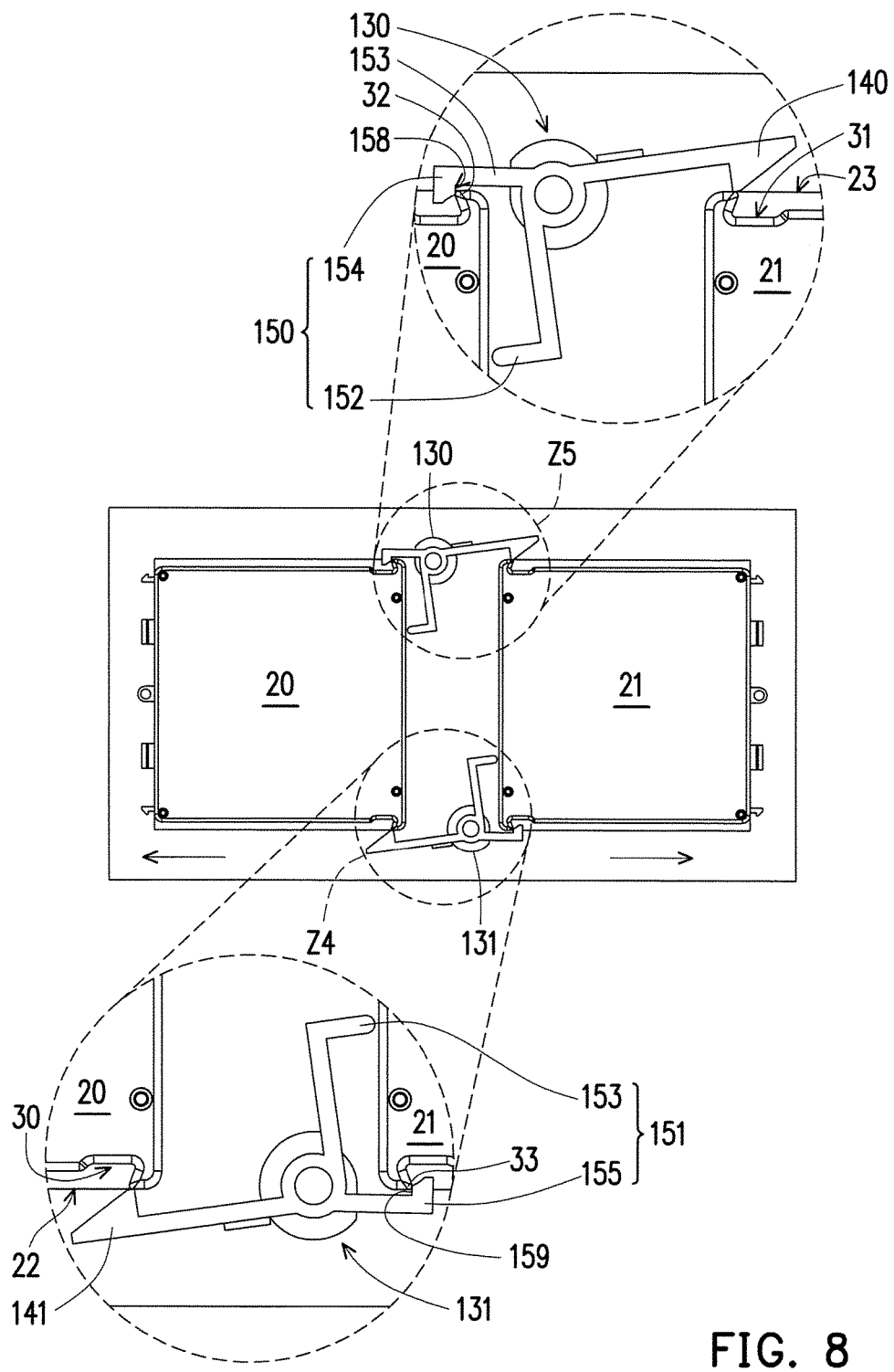
FIG. 8 is a schematic view illustrating the two electronic assemblies in FIG. 3 being removed from the electronic device chassis.

FIG. 8 is a schematic view illustrating the two electronic assemblies in FIG. 3 being removed from the electronic device chassis. Zoom areas Z4 and Z5 are enlarged in FIG. 8, so as to clearly show the operation. Referring to FIG. 8, in the present embodiment, the second bending arm 154 includes a stop surface 158, and the second bending arm 155 includes a stop surface 159. When the two electronic assemblies 20 and 21 together are removed from the two accommodating zones 120 and 121 along the axis A (shown in FIG. 3) in opposite directions, the two second engaging portions 30 and 31 are moved away from the rotating paths of the two first engaging portions 140 and 141 so that the two first engaging portions 140 and 141 of the two limitation mechanisms 130 and 131 respectively lean against the wall surfaces beside the two second engaging portions 31 and 30 of the two electronic assemblies 21 and 20. As a result, the two limitation mechanisms 130 and 131 cannot rotate clockwise and return. At this time, the two stop surfaces 158 and 159 of the two linkage structures 150 and 151 of the two limitation mechanisms 130 and 131 are located in the moving paths of the two electronic assemblies 20 and 21 to restrict and prevent the two electronic assemblies 20 and 21 from being removed from the two accommodating zones 120 and 121. As a result, the fool-proof effect of the electronic device 10 that the two electronic assemblies 20 and 21 cannot be removed at the same time is achieved.

That is, in the process of the user removing the electronic assemblies 20 and 21, the electronic assemblies 20 and 21 are automatically restricted by the limitation mechanisms 130 and 131 and cannot be removed from the accommodating zones 120 and 121. It is convenient for the user to operate without having to perform any other additional actions, so as to achieve fool-proof effect.

Figure 9:
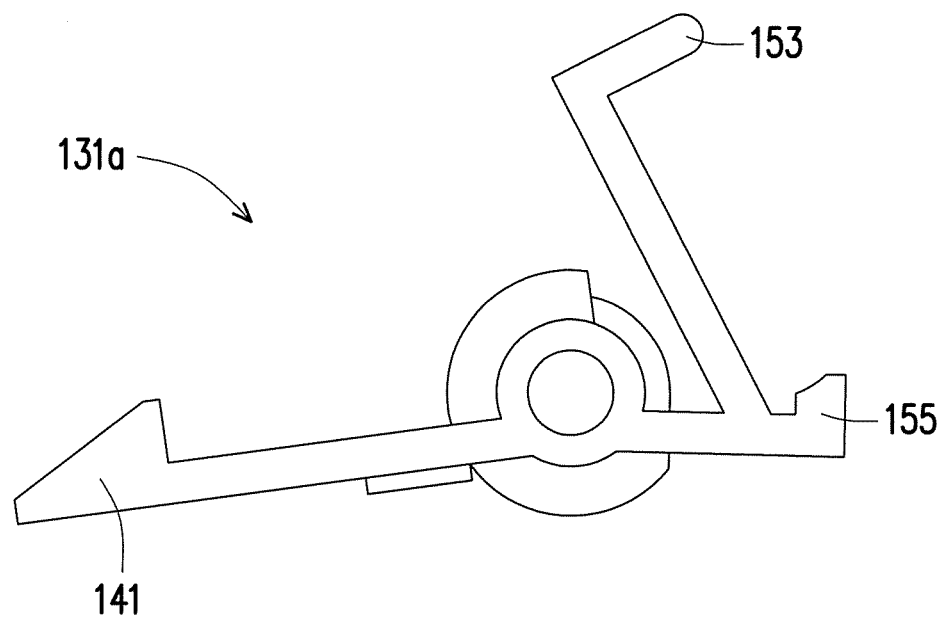
FIG. 9 is a schematic view of a limitation mechanism of an embodiment of the invention.

FIG. 9 is a schematic view of a limitation mechanism of an embodiment of the invention. Referring to FIG. 9, the differences between the limitation mechanism 131a in FIG. 9 and the limitation mechanism 131 in the previous embodiment are described as follows. The first bending arm 153 and the second bending arm 155 of the limitation mechanism 131 in the previous embodiment respectively extend from a rotating center of the linkage structure 151 in different directions. In the present embodiment, the first bending arm 153 of the limitation mechanism 131a extends from the second bending arm 155 in another direction. Certainly, the shapes of the limitation mechanisms 131 and 131a are not limited thereto. It should be noted here, the limitation mechanism 131a is shown in FIG. 9 as an example, and the limitation mechanism in the previous Figures may also adopt the structure of the limitation mechanism 131a.

In the present embodiment, the shape of the limitation mechanism 131a can also achieve the same effect of restricting the movement of the two electronic assemblies 20 and 21. For example, one of the electronic assemblies 20 and 21 is removed from the accommodating zones 120 and 121 through the limitation mechanisms 130 and 131, another one of the electronic assemblies 20 and 21 is restricted and cannot be removed from the accommodating zones 120 and 121, and the fool-proof effect that the two electronic assemblies 20 and 21 cannot be simultaneously removed is achieved.

In the electronic device of the invention, since the two limitation mechanisms of the electronic device chassis are rotatably disposed at two sides of the two accommodating zones of the casing, and, in each of the limitation mechanisms, the first engaging portion is located near one of the accommodating zones and the linkage structure is located near the other one of the accommodating zones, so that when the limitation mechanism is rotated, the first engaging portion and the linkage structure enter or leave the two accommodating zones, respectively. When the two electronic assemblies are disposed in the two accommodating zones, the two second engaging portions are located in rotating paths of the two first engaging portions, and a portion of each of the limitation mechanisms is located in a moving path of the corresponding electronic assembly. Therefore, the limitation mechanisms can simultaneously act on the two electronic assemblies located in the two accommodating zones. Moreover, because of the aforementioned configuration of the electronic device of the invention, when one of the electronic assemblies is located in the accommodating zone and another one of the electronic assemblies is moved in the direction out of the accommodating zone, the linkage structure of one of the limitation mechanisms is configured to be pushed by the moving electronic assembly, so the first engaging portion of the limitation mechanism rotates along and engages with the second engaging portion of the electronic assembly located in the accommodating zone. In other words, after one electronic assembly is removed, another electronic assembly is restricted and cannot be removed from the accommodating zone. When the two electronic assemblies together are removed from the two accommodating zones along the axis in opposite directions, the two second engaging portions move away from the rotating paths of the two first engaging portions so that the two first engaging portions of the two limitation mechanisms respectively lean against the wall surfaces beside the two second engaging portions, and the two linkage structures of the two limitation mechanisms restrict the two electronic assemblies so as to prevent the two electronic assemblies from being removed from the two accommodating zones. Therefore, the electronic device and the electronic device chassis of the invention provide fool-proofing mechanism to ensure at least one of the electronic assemblies remaining in the accommodating zone, and the user can operate in a simple way.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device chassis, configured to detachably dispose two electronic assemblies, the electronic device chassis comprising:
   a casing, comprising two accommodating zones arranged along an axis, the two electronic assemblies are configured to be detachably disposed at the two accommodating zones along the axis; and
   two limitation mechanisms, rotatably disposed at the casing, wherein one of the limitation mechanisms is located near a side of each of the accommodating zones, the other one of the limitation mechanisms is located near another side opposite to the side of each of the accommodating zones, each of the limitation mechanisms comprises a first engaging portion and a linkage structure, in each of the limitation mechanisms, the first engaging portion is located near one of the accommodating zones and the linkage structure is located near the other one of the accommodating zones, so that when the limitation mechanism is rotated, the first engaging portion and the linkage structure enter or leave the two accommodating zones, respectively,
   wherein the two electronic assemblies comprises two second engaging portions corresponding to the two first engaging portions, when the two electronic assemblies are disposed in the two accommodating zones, the two second engaging portions are located in rotating paths of the two first engaging portions, and a portion of each of the limitation mechanisms is located in a moving path of the corresponding electronic assembly.

2. The electronic device chassis as recited in claim 1, wherein each of the accommodating zones has a first side, a second side opposite the first side, and a third side located between the first side and the second side, the two third sides of the two accommodating zones are opposite each other, wherein the first side of one of the accommodating zones and the second side of the other one of the accommodating zones are coplanar with each other, in each of the limitation mechanisms, the first engaging portion is located near the first side of one of the accommodating zones and the linkage structure is located near the second side of the other one of the accommodating zones.

3. The electronic device chassis as recited in claim 2, wherein each of the linkage structures comprises a first bending arm and a second bending arm extending in different directions, the first bending arm and the second bending arm of each of the linkage structures are respectively located near the third side and the second side of one of the accommodating zones.

4. The electronic device chassis as recited in claim 3, wherein each of the second bending arms comprises an inclined surface, when one of the electronic assemblies is removed from the corresponding accommodating zone, the limitation mechanism is configured to rotate so that the inclined surface of the second bending arm moves out of the moving path of the electronic assembly and allows the electronic assembly to pass through, and the first engaging portion of the limitation mechanism rotates along with the second bending arm to engage with the second engaging portion of the other one of the electronic assembly located in the accommodating zone.

5. The electronic device chassis as recited in claim 3, wherein each of the second bending arms comprises a stop surface, when the two electronic assemblies together are removed from the two accommodating zones along the axis in opposite directions, the two second engaging portions are configured to move away from the rotating paths of the two first engaging portions so that the two first engaging portions of the two limitation mechanisms respectively lean against wall surfaces of the two electronic assemblies, the wall surfaces are beside the two second engaging portions, and the two stop surfaces are configured to restrict the two electronic assemblies so as to prevent the two electronic assemblies from being removed from the two accommodating zones.

6. The electronic device chassis as recited in claim 3, wherein the first engaging portion is a hook and the second engaging portion is a groove.

7. The electronic device chassis as recited in claim 1, further comprising:
two first connecting ports, disposed at the casing and located in the two accommodating zones.

8. The electronic device chassis as recited in claim 1, further comprising:
two torsional springs, disposed between the two limitation mechanisms and the casing.

9. An electronic device, comprising:
an electronic device chassis, comprising:
a casing, comprising two accommodating zones arranged along an axis; and
two limitation mechanisms, rotatably disposed at the casing, wherein one of the limitation mechanisms is located near a side of each of the accommodating zones, the other one of the limitation mechanisms is located near another side opposite to the side of each of the accommodating zones, each of the limitation mechanisms comprises a first engaging portion and a linkage structure, in each of the limitation mechanisms, the first engaging portion is located near one of the accommodating zones and the linkage structure is located near the other one of the accommodating zones, so that when the limitation mechanism is rotated, the first engaging portion and the linkage structure enter or leave the two accommodating zones, respectively; and
two electronic assemblies, detachably disposed at the two accommodating zones along the axis, each of the electronic assemblies comprising a second engaging portion, the two second engaging portions respectively corresponding to the two first engaging portions, wherein
when the two electronic assemblies are disposed in the two accommodating zones, the two second engaging portions are located in rotating paths of the two first engaging portions, and a portion of each of the limitation mechanisms is located in a moving path of the corresponding electronic assembly.

10. The electronic device as recited in claim 9, wherein each of the accommodating zones has a first side, a second side opposite the first side, and a third side located between the first side and the second side, the two third sides of the two accommodating zones are opposite each other, wherein the first side of one of the accommodating zones and the second side of the other one of the accommodating zones are coplanar with each other, in each of the limitation mechanisms, the first engaging portion is located near the first side of one of the accommodating zones and the linkage structure is located near the second side of the other one of the accommodating zones.

11. The electronic device as recited in claim 10, wherein each of the linkage structures comprises a first bending arm and a second bending arm extending in different directions, the first bending arm and the second bending arm of each of the linkage structures are respectively located near the third side and the second side of one of the accommodating zones.

12. The electronic device as recited in claim 11, wherein each of the electronic assemblies has a first electronic assembly side surface, a second electronic assembly side surface opposite the first electronic assembly side surface, and a third electronic assembly side surface located between the first electronic assembly side surface and the second electronic assembly side surface, the second engaging portion is located on the first electronic assembly side surface, the first bending arm is configured to lean against the third electronic assembly side surface.

13. The electronic device as recited in claim 12, wherein, when the two electronic assemblies are located in the two accommodating zones, the second bending arm of one of the linkage structures is located in the moving path of the corresponding electronic assembly, and a gap exists between the second bending arm and a hook of the second electronic assembly side surface of the electronic assembly, the first engaging portion of the other linkage structure leans against the first electronic assembly side surface of the electronic assembly.

14. The electronic device as recited in claim 11, wherein each of the second bending arms comprises an inclined surface, when one of the electronic assemblies is removed from the corresponding accommodating zone, the limitation mechanism is configured to rotate so that the inclined surface of the second bending arm moves out of the moving path of the electronic assembly and allows the electronic assembly to pass through, and the first engaging portion of the limitation mechanism rotates along with the second bending arm to engage with the second engaging portion of the other one of the electronic assembly located in the accommodating zone.

15. The electronic device as recited in claim 11, wherein each of the second bending arms comprises a stop surface, when the two electronic assemblies together are removed from the two accommodating zones along the axis in opposite directions, the two second engaging portions are configured to move away from the rotating paths of the two first engaging portions so that the two first engaging portions of the two limitation mechanisms respectively lean against wall surfaces of the two electronic assemblies, the wall surfaces are beside the two second engaging portions, and the two stop surfaces are configured to restrict the two electronic assemblies so as to prevent the two electronic assemblies from being removed from the two accommodating zones.

16. The electronic device as recited in claim 9, further comprising:
two first connecting ports, disposed at the casing and located in the two accommodating zones, wherein each of the electronic assemblies comprises a second connecting port, the two first connecting ports are configured to dock in the two second connecting ports.

17. The electronic device as recited in claim 16, wherein the two electronic assemblies are two batteries.

18. The electronic device as recited in claim 9, wherein the electronic device chassis further comprises two torsional springs disposed between the two limitation mechanisms and the casing.

19. The electronic device as recited in claim 9, wherein the first engaging portion is a hook and the second engaging portion is a groove.

* * * * *